United States Patent
Zhou

(10) Patent No.: US 11,602,044 B2
(45) Date of Patent: Mar. 7, 2023

(54) DRIVER BOARD ASSEMBLIES AND METHODS OF FORMING THE SAME

(71) Applicant: Toyota Motor Engineering & Manufacturing North America, Inc., Plano, TX (US)

(72) Inventor: Feng Zhou, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 145 days.

(21) Appl. No.: 16/943,470

(22) Filed: Jul. 30, 2020

(65) Prior Publication Data
US 2022/0039252 A1 Feb. 3, 2022

(51) Int. Cl.
*H05K 7/20* (2006.01)
*H05K 1/02* (2006.01)
*H02M 1/32* (2007.01)

(52) U.S. Cl.
CPC ............ *H05K 1/0272* (2013.01); *H02M 1/32* (2013.01); *H05K 7/20254* (2013.01); *H02M 1/327* (2021.05); *H05K 2201/064* (2013.01)

(58) Field of Classification Search
None
See application file for complete search history.

(56) References Cited

U.S. PATENT DOCUMENTS

| | | | | |
|---|---|---|---|---|
| 5,001,548 A | * | 3/1991 | Iversen | H01L 23/473 257/E23.098 |
| 6,490,159 B1 | * | 12/2002 | Goenka | H05K 1/0272 174/15.1 |
| 6,665,185 B1 | | 12/2003 | Kulik et al. | |
| 6,827,134 B1 | * | 12/2004 | Rightley | G06F 1/203 165/104.21 |
| 7,495,914 B2 | * | 2/2009 | Tilton | H05K 7/20345 361/689 |

(Continued)

FOREIGN PATENT DOCUMENTS

CN 105491822 A 4/2016
CN 108184305 A 6/2018
(Continued)

OTHER PUBLICATIONS

PCB-integrated heat exchanger for cooling electronics using microchannels fabricated with the direct-write method (https://www.researchgate.net/publication/224349497_PCB-Integrated_Heat_Exchanger_for_Cooling_Electronics_Using_Microchannels_Fabricated_With_the_Direct-Write_Method), Jan. 2009.

*Primary Examiner* — Courtney L Smith
(74) *Attorney, Agent, or Firm* — Dinsmore & Shohl LLP

(57) ABSTRACT

A method of manufacturing a driver board assembly includes embedding one or more power device assemblies within a first PCB material layer, forming one or more cooling channels within a surface of the first PCB material layer such that the one more cooling channels extend proximate to the one or more power device assemblies, forming a plurality of thermally conductive vias extending between a surface of the one or more power device assemblies and the one or more cooling channels, and bonding a second PCB material layer to the first PCB material layer to enclose the one or more cooling channels between the first PCB material layer and the second PCB material layer.

20 Claims, 10 Drawing Sheets

(56) References Cited

U.S. PATENT DOCUMENTS

| | | | | |
|---|---|---|---|---|
| 7,969,734 | B2 * | 6/2011 | Arik | F28F 3/04 |
| | | | | 361/695 |
| 8,305,762 | B2 * | 11/2012 | Wits | H01L 23/427 |
| | | | | 361/689 |
| 8,488,315 | B2 * | 7/2013 | Herron | H05K 7/20927 |
| | | | | 361/677 |
| 8,953,314 | B1 * | 2/2015 | Fedorov | H01L 23/473 |
| | | | | 361/677 |
| 9,500,416 | B2 * | 11/2016 | Nguyen | F28F 21/08 |
| 2002/0163781 | A1 | 11/2002 | Bartola et al. | |
| 2006/0026983 | A1 * | 2/2006 | Tilton | H05K 7/20345 |
| | | | | 257/E23.1 |
| 2006/0034052 | A1 | 2/2006 | Chang et al. | |
| 2012/0257354 | A1 * | 10/2012 | Dede | H01L 23/473 |
| | | | | 361/689 |
| 2020/0367353 | A1 * | 11/2020 | Yahara | H05K 1/0203 |

FOREIGN PATENT DOCUMENTS

| | | |
|---|---|---|
| CN | 110809359 A | 2/2020 |
| DE | 19711533 A1 | 9/1998 |
| DE | 102008050065 A1 | 4/2010 |
| DE | 202010017772 U1 | 10/2012 |
| JP | 4878762 B2 | 2/2012 |

* cited by examiner

DRIVER BOARD ASSEMBLIES AND METHODS OF FORMING THE SAME

TECHNICAL FIELD

The present specification generally relates to driver board assemblies and methods of forming the same and, more specifically, to driver board assemblies including power devices embedded with a printed circuit board (PCB) substrate having integrated cooling channels.

BACKGROUND

A power control unit (PCU) may be used in motor-drive hybrid and electric vehicles. PCUs may include power devices arranged in inverter and/or converter topologies, which are packaged in a plurality of power cartridges which may be individually connected to a driver board. The power cartridges may be sandwiched in a liquid cooler to maintain a particular temperature while the power devices are operated (for example, switched one and/or off), which generates heat. The power cartridges are mounted to the driver board via pins and may extend a distance from the driver board, leading to a larger volume profile. As PCU designs are reduced to smaller, compact footprints, is may be desirable to develop driver board assemblies having smaller volume profiles while still providing sufficient cooling.

SUMMARY

In one aspect, a method of manufacturing a driver board assembly includes embedding one or more power device assemblies within a first PCB material layer, forming one or more cooling channels within a surface of the first PCB material layer such that the one or more cooling channels extend proximate to the one or more power device assemblies, forming a plurality of thermally conductive vias extending between a surface of the one or more power device assemblies and the one or more cooling channels, and bonding a second PCB material layer to the first PCB material layer to enclose the one or more cooling channels between the first PCB material layer and the second PCB material layer.

In another aspect, a driver board assembly includes a first PCB material layer, one or more power device assemblies, one or more cooling channels, a plurality of thermally conductive vias, and a second PCB material layer. The one or more power device assemblies are embedded within the first PCB material layer. The one or more cooling channels are formed within a surface of the first PCB material layer such that the one or more cooling channels extend proximate to the one or more power device assemblies. The plurality of thermally conductive vias extend between a surface of the one or more power device assemblies and the one or more cooling channels. The second PCB material layer is bonded to the first PCB material layer to enclose the one or more cooling channels between the first PCB material layer and the second PCB material layer.

In yet another aspect, a driver board assembly includes a first PCB material layer, one or more power devices assemblies, one or more cooling channels, and a second PCB material layer. The one or more power device assemblies are embedded within the first PCB material layer. The one or more cooling channels are formed within a surface of the first PCB material layer such that the one or more cooling channels extend proximate to the one or more power device assemblies. The second PCB material layer is bonded to the first PCB material layer to enclose the one or more cooling channels between the first PCB material layer and the second PCB material layer.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
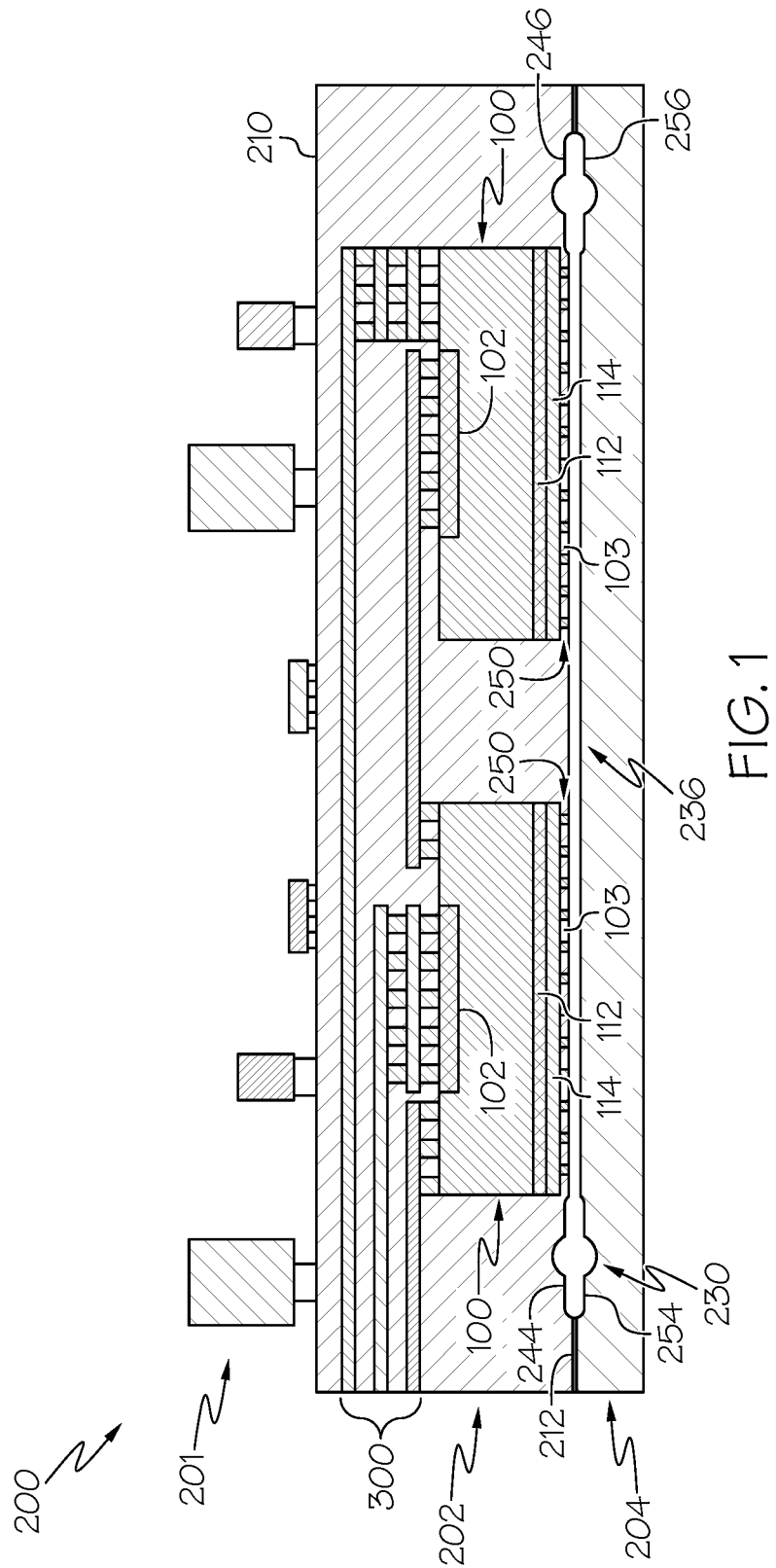
FIG. 1 schematically depicts a cross-section of an illustrative driver board assembly, according to one or more embodiments shown and described herein.

Embodiments of the present disclosure are directed to driver board assemblies and methods for assembling driver board assemblies. In the embodiments described herein methods include embedding one or more power device assemblies within a first printed circuit board (PCB) material layer. One or more cooling channels may be formed within the first PCB material layer adjacent (for example, beneath) the one or more power device assemblies. A second PCB material layer may be bonded to the first PCB material layer to enclose or encapsulate the one or more cooling channels between the first PCB material layer and the second PCB material layer to form a PCB substrate such that the one or more cooling channels are integrated within the driver board assembly. In some embodiments, thermally conductive vias may thermally couple the one or more power device assemblies to the one or more cooling channels. By integrating the one or more power device assemblies into a body of the PCB substrate, a more compact, power dense driver board may be achieved. Additionally, by providing integrated cooling channels, heat generated by the one or more power device assemblies may be transferred to coolant routed through the cooling channels. The thermal path between the one or more power device assemblies to the cooling channels may be very short, thereby reducing a side profile of the driver board assembly while increasing power density. Moreover, embodiments of the present disclosure are able to operate under high power (e.g., 40+ kW) environments, thereby providing a greater range of uses. These and additional embodiments will be described in greater detail herein.

Conventional motor drive systems in electrified vehicles (e.g., hybrid electrical vehicles, plug-in hybrid electric vehicles, fuel cell vehicles, and electric vehicles) may include a motor and a power control unit (PCU) that supplies current to the motor from a current source (e.g., a battery). Accordingly, the PCU may include any number of components and/or modules that may allow the PCU to control current supplied to the motor (or other vehicle electronic device). In particular, the PCU may include a driver board assembly. However, and as noted above, conventional PCUs may include power devices which are packaged in power cartridges which may be connected to a driver board. The power cartridges may be sandwiched in a liquid cooler to maintain a particular temperature while the power devices are operated (for example, switched on/off), which generates heat. These cartridges and cooling assemblies may have larger volume profiles and/or result in reduced power density.

Embodiments of the present disclosure are directed to assemblies providing lower volume profiles and/or greater power density. Moreover, embodiments of the present disclosure allow for operation of high power devices (for example, greater than or equal to 40 kW, 50 kW, 60 kW, 70 kW, 80 kW, 90 kW, 100 kW, 110 kW, 120 kW, 130 kW, 140 kW, or 150 kW) that operate under high temperatures (for example, in excess of 100° C., 150° C., 175° C., 200° C., 225° C., or 250° C.), which generate a large amount of heat that must be removed for the continued operation of the PCU. In particular, the embedded cooling channels, as will be described in greater detail below, allow for efficient cooling of the one or more power device assemblies to prevent overheating, damage, or the like.

Referring now to FIG. 1, an embodiment of a driver board assembly 200 providing a lower volume profile, integrated cooling, and increased power density is schematically depicted. The driver board assembly 200 may generally include a first PCB material layer 202 bonded (e.g., laminated, diffusion bonded, or the like) to a second PCB material layer 204. Mounted to the first PCB material layer 202 may be one or more of passive components and/or electrical components 201, such as logic circuits, which allow the driver board assembly 200 to function as a gate driver, for example. The one or more passive components and/or electrical components 201 may include one or more resistors, capacitors, inductors, diodes, oscillators, transistors, integrated circuits, switches, terminals, or the like.

Generally, PCB material layers are formed from one or more conductive layers 300 (e.g., copper, aluminum, silver, nickel, any combination thereof, or the like) and/or one or more layers of non-conductive substrates (e.g., dielectric polymer layers). In some embodiments, the one or more conductive layers 300 are etched to form various conductive pathways and are laminated onto and/or between sheets/layers of non-conductive substrates (e.g., dielectric polymer layers) to form an integral and uniformly thick PCB substrate. As illustrated in FIG. 1, the one or more conductive layers 300 may provide electrical communication between one or more power device assemblies 100 and, for example, a power source (not depicted) and/or electrical component (not depicted). For example, the one or more conductive layers 300 may connect the one or more power device assemblies 100 in a converter and/or inverter topology through, for example, a plurality of thermally conductive vias (e.g., copper, aluminum, zinc, or the like). In an inverter topology the one or more conductive layers 300 may electrically couple a power source (such as a battery) to the one or more power device assemblies 100, which may convert the current of the power source to, for example, an alternating current such as may be used to power an electric motor. In the illustrated embodiments, the one or more conductive layers 300 may be arranged along a first side (e.g., a top side) of the one or more power device assemblies 100, while one or more cooling channels 240 are formed on an opposite side (e.g., a bottom side) of the one or more power device assemblies 100. As will be described in greater detail below, the one or more cooling channels 240 may accommodate circulation of coolant in close proximity to the one or more power device assemblies 100 to remove heat from the one or more power device assemblies 100. Because the one or more cooling channels 240 are arranged in close proximity to the one or more power device assemblies 100, the overall thickness of the driver board assembly 200 may be reduced, thereby providing a lower volume profile as compared to conventional driver board assemblies. Various features of the present embodiments will now be described in greater detail with reference to a method of assembling a driver board assembly 200.

Figure 2:
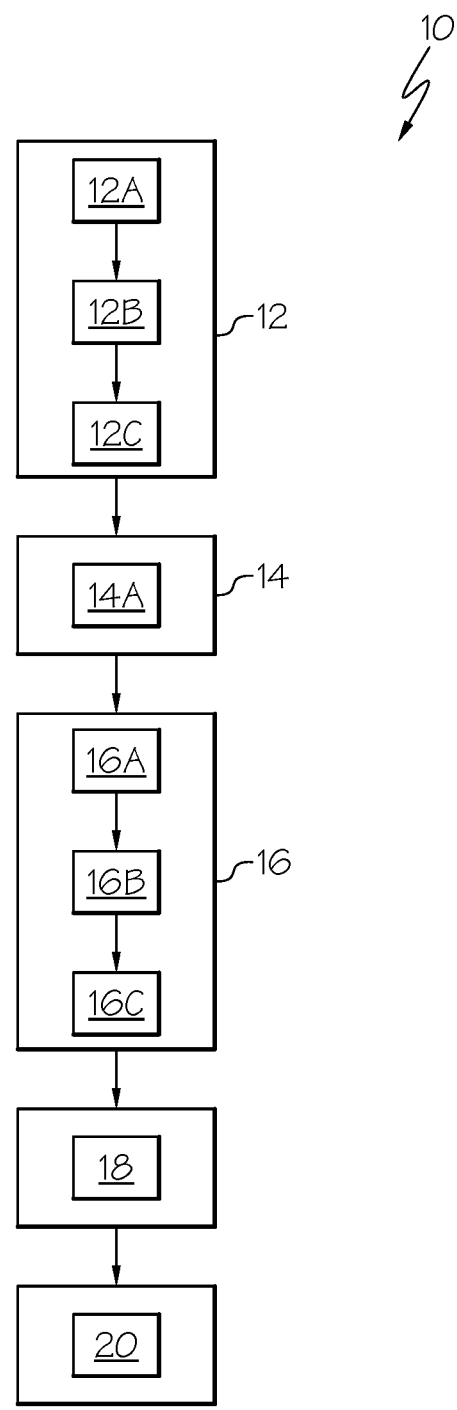
FIG. 2 depicts a flowchart depicting an illustrative method of assembling a driver board assembly, according to one or more embodiments shown and described herein.

Referring now to FIG. 2, a flow chart depicting a method 10 of assembling a driver board assembly 200, such as illustrated in FIG. 1, is generally depicted. It is noted that the method 10 may include a greater or fewer number of steps than depicted in any order, without departing from the scope of the present disclosure.

Figure 3A:
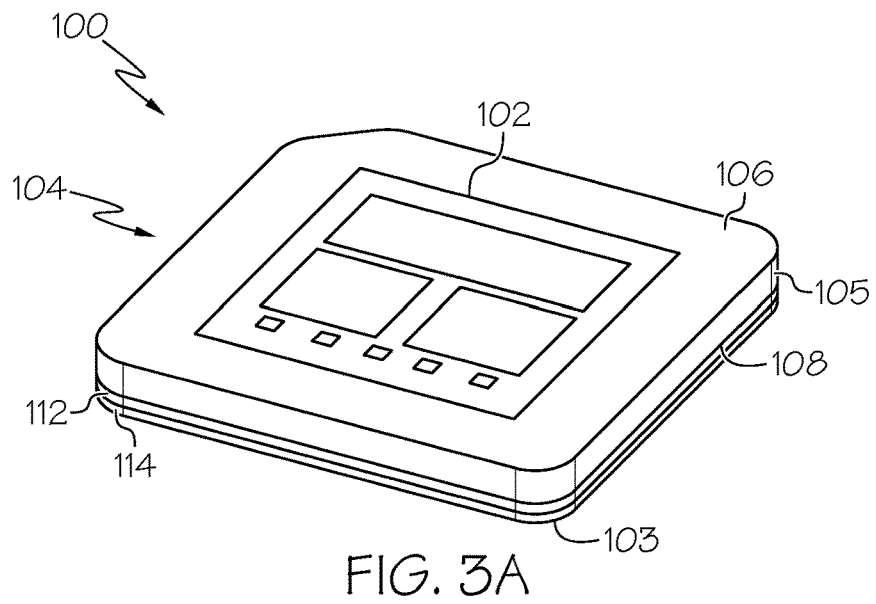
FIG. 3A schematically depicts a perspective view of an illustrative power device assembly, according to one or more embodiments shown and described herein.

For example, the method 10 may include, at block 12, assembling the one or more power device assemblies 100, such as illustrated in FIG. 3A. It is noted that in some embodiments, the one or more power device assemblies 100 may include pre-fabricated power device assemblies, which are not separately assembled, prior to assembly within the driver board assembly 200. Referring to FIG. 3A, a power device assembly 100 is schematically illustrated. For example, the power device assembly 100 may include a power device 102, a first conductive substrate 104, an insulation layer 112, and/or a second conductive substrate 114. In some embodiments, assembling one or more power device assemblies 100 may include embedding the power device 102 within the first conductive substrate 104 at block 12a, bonding the insulation layer 112 to the first conductive substrate 104 at block 12b, and/or bonding the second conductive substrate 114 to the first conductive substrate 104 at block 12c, for example, via the insulation layer 112. It is noted that assembly of the one or more power device assemblies 100 including blocks 12a-12c may take place in any order with a fewer or greater number of steps.

The power device 102 may include any electronic device, the operation of which may generate heat. For example, the power device 102 may include a semiconductor device such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, the power device 102 may include a wide-bandgap semiconductor, and may be formed from any suitable material such as, but not limited to, silicon carbide (SiC), silicon dioxide ($SiO_2$), aluminum nitride (AlN), gallium nitride (GaN), and boron nitride (BN), and the like. In some embodiments, the power device 102 may operate at high current and under high temperatures, for example in excess of 250° C. and generate a large amount of heat that must be removed for the continued operation of the example driver board assembly 200.

Figure 3B:
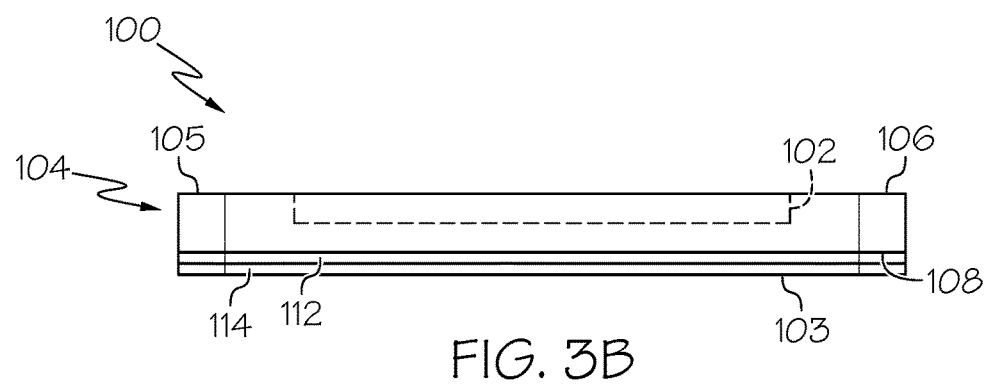
FIG. 3B schematically depicts a side view of the power device assembly of FIG. 3A, according to one or more embodiments shown and described herein.
Figure 3C:
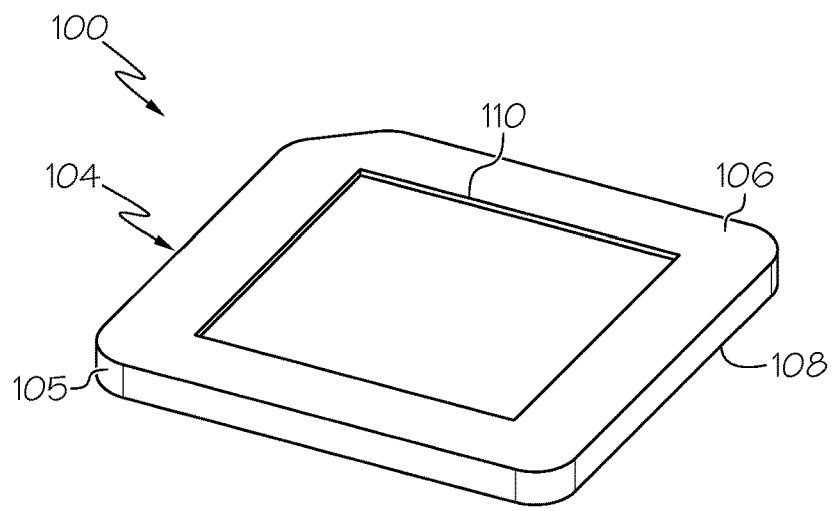
FIG. 3C schematically depicts an illustrative first conductive substrate of a power device assembly in isolation, according to one or more embodiments shown and described herein.

The first conductive substrate 104 may be made from any electrically and/or thermally conductive material such as, for example, but not limited to, copper, aluminum, zinc, or the like. Referring to FIG. 3C, the first conductive substrate 104 is depicted in isolation from the power device 102. The first conductive substrate 104 may include a body 105 defining a first surface 106 and a second surface 108 opposite the first surface 106. Formed within the body 105 and extending inward from the first surface 106 may be a cavity 110. The cavity 110 may be sized and shaped to receive the power device 102. For example, when positioned within the cavity 110, such as illustrated in FIGS. 3A and 3B, the power device 102 may be flush with the first surface 106. The power device 102 may be bonded to the first conductive substrate 104 through any conventional bonding techniques includes high temperature bonding technologies such as silver sintering, transient liquid phase (TLP) bonding, or the like.

Referring now to FIG. 3B, a side view of the power device assembly 100 is generally depicted. In some embodiments, mounted to the second surface 108 of the first conductive substrate 104 may be one or more additional layers or substrates. The one or more additional layers or substrates may include, but are not limited to, the insulation layer 112 and/or the second conductive substrate 114. Each of the additional layers may be coextensive with the second surface 108 of the first conductive substrate 104.

The insulation layer 112 may include any electrically insulating material. In some embodiments, the insulation layer 112 may also be thermally conductive. For example, the insulation layer 112 may be an insulated metal substrate (IMS) which includes a dielectric material that serves as a medium for thermal conduction and may be also used for bonding. In embodiments, the insulation layer 112 may include a ceramic layer including but not limited to alumina ($Al_2O_3$), Aluminum nitride (AlN), Beryllium oxide (BeO), or the like. As will be described below, the insulation layer 112 may prevent electrical conduction through a bottom surface 103 of the power device assembly 100. However, in some embodiments, there may not be a insulation layer 112. For example, embodiments wherein coolant include dielectric coolant, there may not be a separate insulation layer 112. In yet further embodiments, insulation may be provided via a thin layer (e.g., about 100 μm or less) of PCB material.

Mounted to the insulation layer 112 opposite the first conductive substrate 104 may be the second conductive substrate 114. The second conductive substrate 114 may be the same or a different material from the first conductive substrate 104, for example, but not limited to, copper, aluminum, zinc, or the like. The insulation layer 112 may direct bond the first conductive substrate 104 to the second conductive substrate 114. For example, bonding methods such a direct bonded copper (DBC), direct bonded aluminum (DBA), active metal brazing (AMB), or the like. The power device 102 may be bonded to the first conductive substrate 104 prior to or after bonding of the insulation layer 112 and/or the second conductive substrate 114. However, in some embodiments, such as where there is no insulation layer 112, there may not be a second conductive substrate 114.

Referring again to FIG. 2, the method 10 may further include, at block 14, embedding the one or more power device assemblies 100 within the first PCB material layer 202. As noted above, PCB material layers are formed from one or more layers of conductive material (e.g., copper, aluminum, silver, nickel, or the like) etched to form various conductive pathways laminated onto and/or between sheets/layers of non-conductive substrates (e.g., dielectric polymer layers) to form an integral and uniformly thick PCB material layer. The one or more layers may be fused via heat and/or pressure to form a first PCB material layer 202. The one or more layers may be fused together around the one or more power device assemblies 100. For example, one or more cavities configured to receive the one or more power device assemblies 100 may be carved within the one or more layers of the first PCB material layer 202. Additional layering (e.g., of dielectric material) may be added to cover the one or more power device assemblies 100 positioned within the one or more recesses to enclose or embed the one or more power device assemblies 100 within the first PCB material layer 202. Thereafter, the various layers of the first PCB material layer 202 may be laminated together (e.g., via heat and/or pressure).

Figure 4:
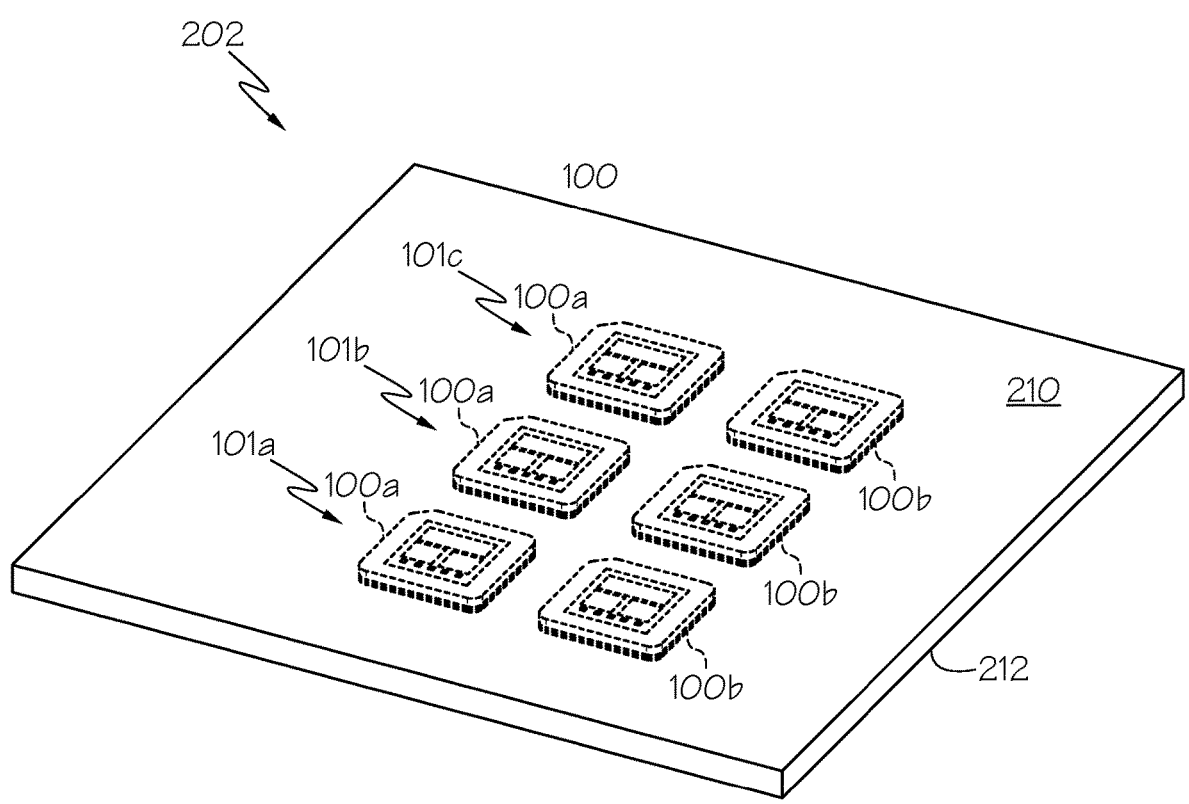
FIG. 4 depicts one or more illustrative power device assemblies embedded within a first PCB material layer, according to one or more embodiments shown and described herein.
Figure 5:
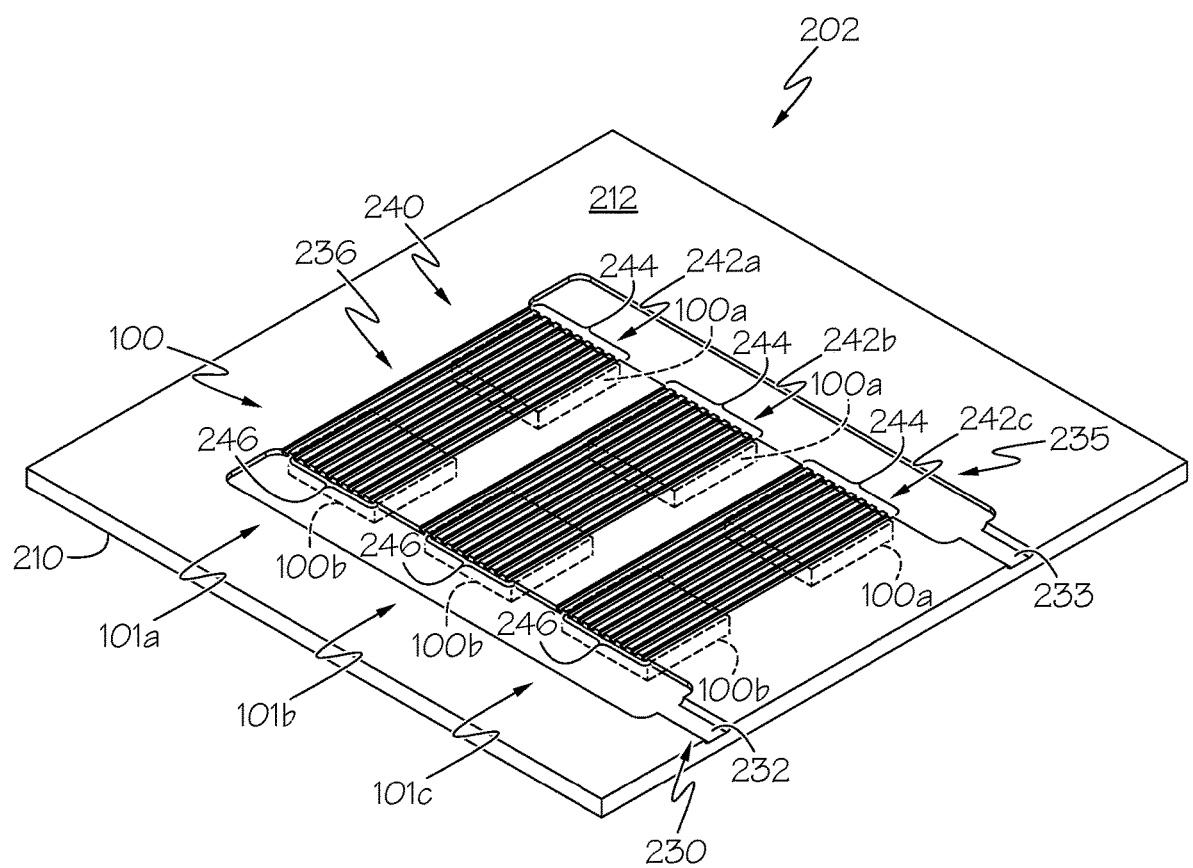
FIG. 5 depicts one or more cooling channels formed within the first PCB material layer of FIG. 4, according to one or more embodiments shown and described herein.
Figure 6:
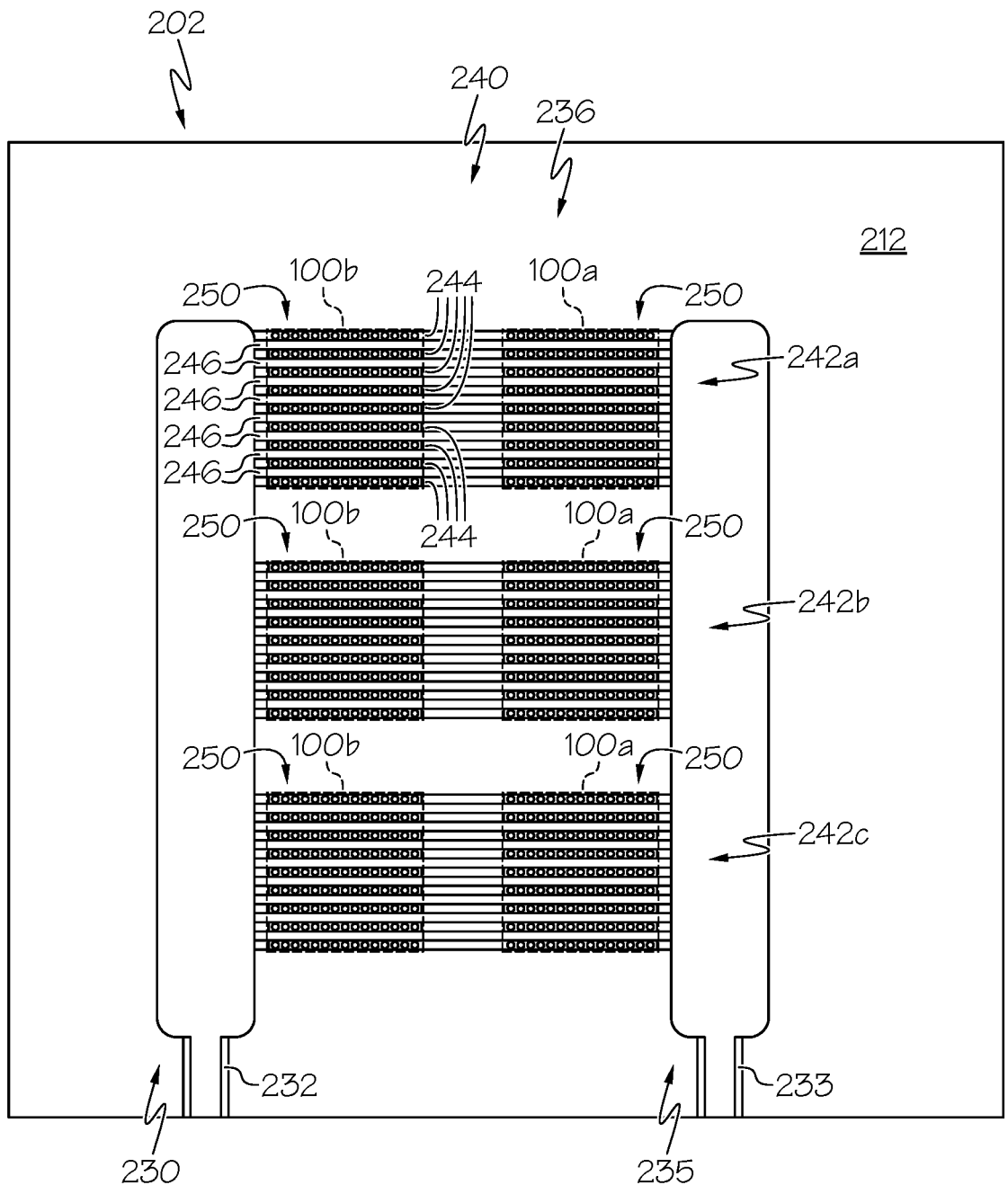
FIG. 6 depicts a plurality of thermally conductive vias formed within the one or more cooling channels of FIG. 5, according to one or more embodiments shown and described herein.

FIG. 4 illustrates a perspective view of one or more power device assemblies 100 embedded within the first PCB material layer 202. There may be multiple power device assemblies 100 embedded within the first PCB material layer 202, for example, two or more, four or more, six or more, or the like. Referring again to FIG. 2, the method 10 may include, at block 14a, arranging the one or more power device assemblies 100 within a particular topology, such as an inverter topology, a converter topology, or the like. For example, in some embodiments, the one or more power device assemblies 100 may be arranged with the one or more conductive layers 300, such as illustrated in FIG. 1, to provide the inverter, converter, or other electrical topology. For example, driver board assemblies, according to the present disclosure may include pairs of power device assemblies (for example, a first pair 101a, a second pair 101b, and/or a third pair 101c) arranged in an inverter, converter, or other topology. The first PCB material layer 202 may include a first surface 210 and a second surface 212 opposite the first surface 210. As illustrated in FIG. 1, the one or more power device assemblies 100 may be embedded within the first PCB material layer 202 so to be arranged between the first surface 210 and the second surface 212 and spaced therefrom.

Referring again to FIG. 2, at block 16, the method 10 includes forming the one or more cooling channels 240 within the first PCB material layer 202 and/or a second PCB material layer 204, as will be described in greater detail herein. As will be described below forming the one or more cooling channels 240 may include forming an inlet channel 230 at block 16a, an outlet channel 235 at block 16b, and one or more lateral channels 236 at block 19c, such as a plurality of parallel lateral channels 236.

Figure 9:
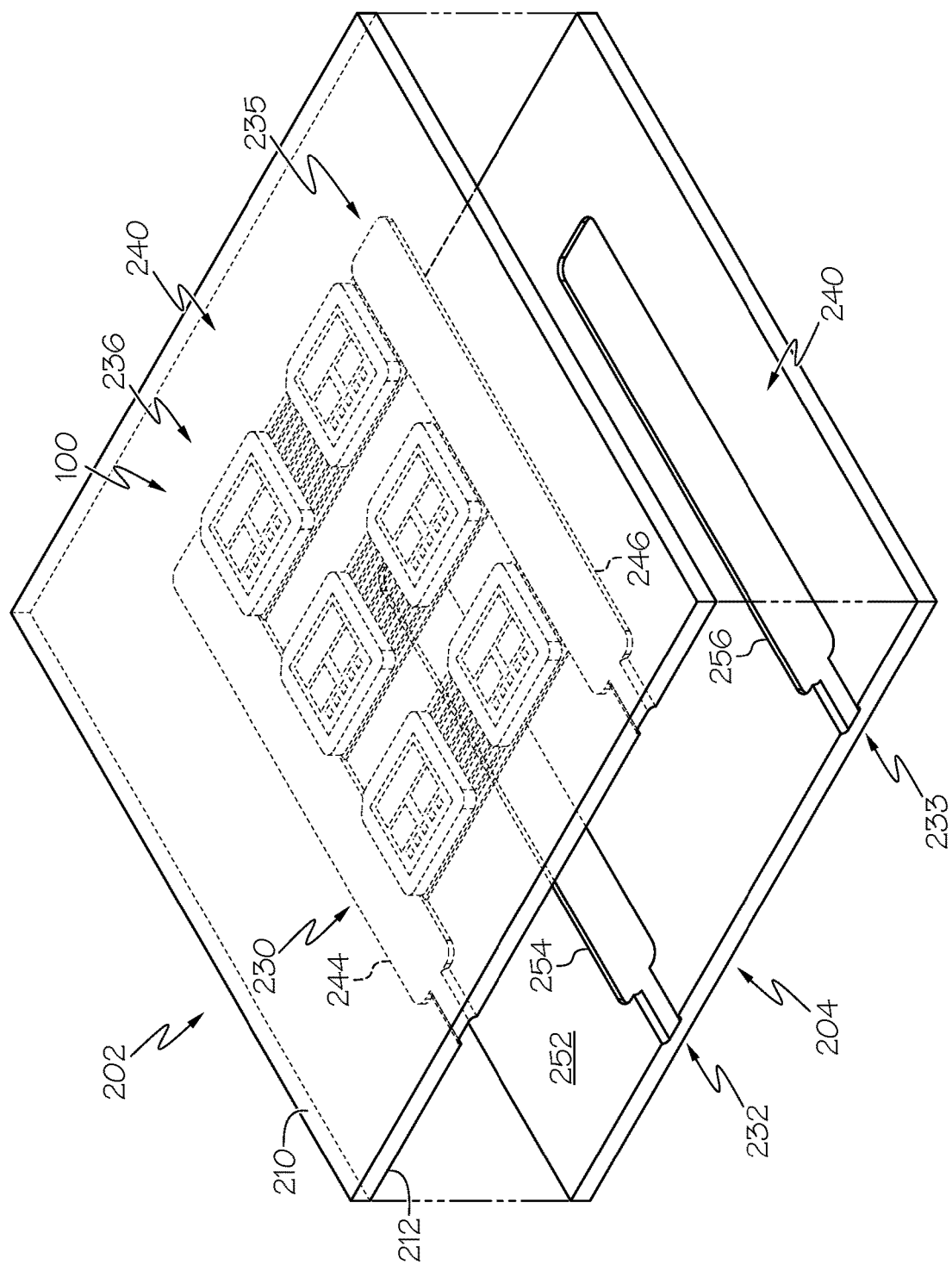
FIG. 9 depicts a first PCB substrate over a second PCB substrate in a pre-assembly condition, according to one or more embodiments shown and described herein.

In particular, and with reference to FIG. 4, one or more cooling channels 240 may be formed within the second surface 212 of the first PCB material layer 202 and/or a first surface 252 of the second PCB material layer 204 (see FIG. 9). For example, the one or more cooling channels 240 may be carved, molded, or the like. In embodiments, the one or more cooling channels 240 are formed so as to provide coolant passageways beneath the one or more power device assemblies 100 such that at least a portion of the one or more cooling channels 240 extend proximate to the one or more power device assemblies 100.

Referring to also to FIGS. 1, 5, 6, and 8-10, and as noted above, the one or more cooling channels 240 may include an inlet channel 230 and an outlet channel 235. Extending laterally between the inlet channel 230 and the outlet channel 235 may be one or more lateral channels 236 such as a plurality of parallel lateral channels 236 that are in fluid communication with the inlet channel 230 and the outlet channel 235. For example, coolant may enter the driver board assembly 200 through an inlet port 232, illustrated in FIG. 10, fluidly coupled to a coolant source (not shown), into the inlet channel 230, which may function as a manifold to divert the coolant through the one or more lateral channels 236. The coolant may exit the one or more lateral channels 236 into the outlet channel 235 where it may exit the driver board assembly 200 through the outlet port 233, also illustrated in FIG. 10. The cooling fluid may be circulated through the one or more cooling channels 240 of the driver board assembly 200 via a pump, for example. In some embodiments, the coolant may be circulated through a heat exchanger to cool the coolant.

Figure 10:
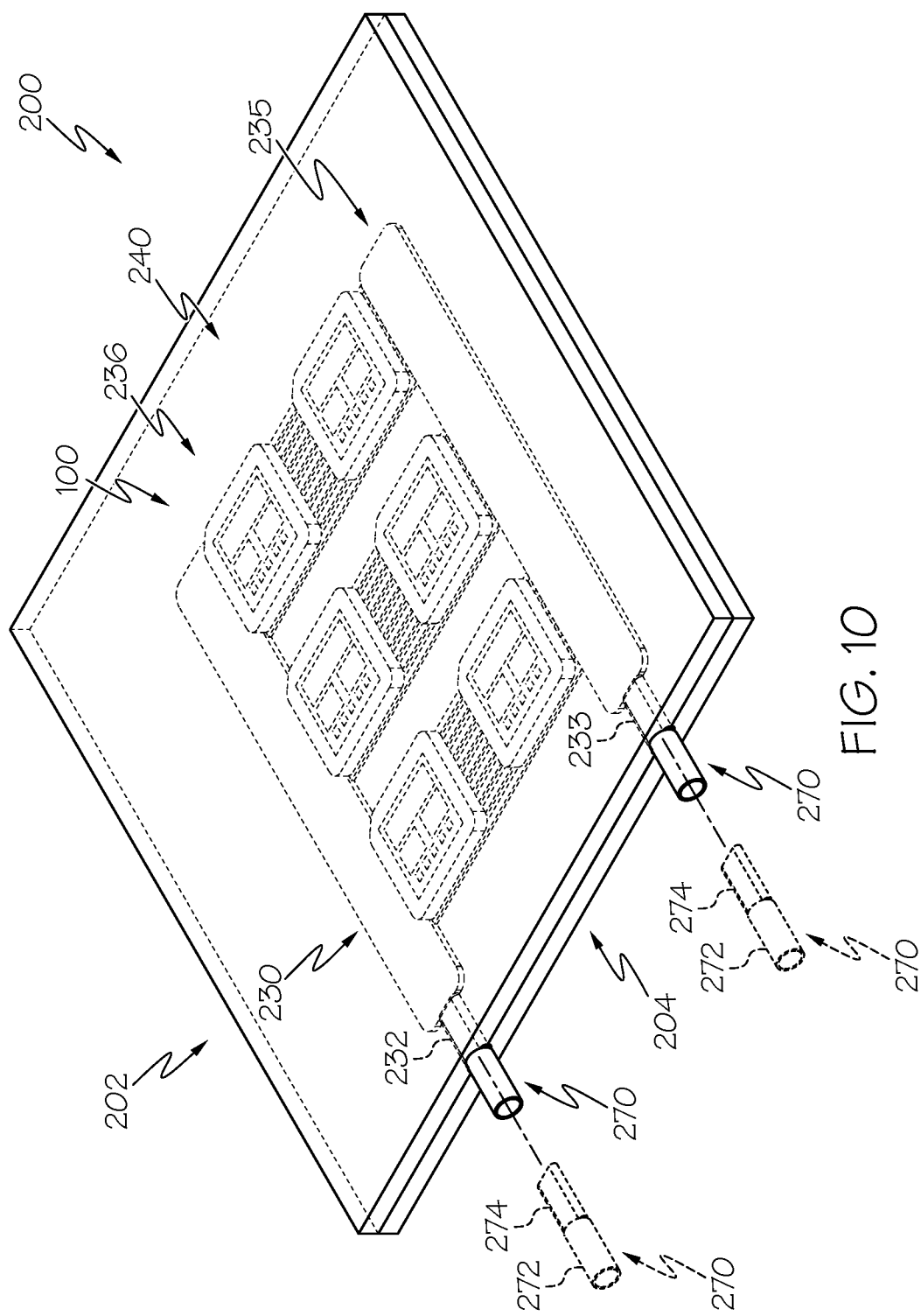
FIG. 10 depicts a first PCB substrate coupled to a the second PCB substrate to form a driver board assembly having integrated cooling channels, according to one or more embodiments shown and described herein.

Referring specifically to FIG. 9, the inlet channel 230 may include a first inlet channel portion 244 formed within the second surface 212 of the first PCB material layer 202 and a second inlet channel portion 254 formed within a first surface 252 of the second PCB material layer 204. The first inlet channel portion 244 and the second inlet channel portion 254 may be sized and arranged such that when the first PCB material layer 202 and the second PCB material layer 204 are bonded together, a volume of the first inlet channel portion 244 and the second inlet channel portion 254 are combined, such as illustrated in FIGS. 1 and 10.

Similarly, and again in reference to FIG. 9, the outlet channel 235 may include a first outlet channel portion 246 formed within the second surface 108 of the 212 of the first PCB material layer 202 and a second outlet channel portion 256 formed within a first surface 252 of the second PCB material layer 204. The first outlet channel portion 246 and the second outlet channel portion 256 may be sized and arranged such that when the first PCB material layer 202 and the second PCB material layer 204 are bonded together, a volume of the first outlet channel portion 246 and the second outlet channel portion 256 are combined, such as illustrated in FIGS. 1 and 10.

As noted above, the inlet channel 230 may include an inlet port 232 configured to fluidly couple the one or more cooling channels 240 to a coolant source (not shown) and the outlet channel 235 may include an outlet port 233 configured to allow removal of coolant from the one or more cooling channels 240 and from the driver board assembly 200. In such embodiments, the inlet port 232 and the outlet port 233, may be at least partially formed in both the first PCB material layer 202 and the second PCB material layer 204 and may allow for fluid connections along a side edge (away from the major surfaces) of the driver board assembly 200. However, it is contemplated that the inlet port 232 and/or the outlet port 233 may be instead formed completely within one of the first PCB material layer 202 and the second PCB material layer 204 such that fluid couplings are provided along one of the major surfaces of the driver board assembly 200.

As noted above and with reference to FIG. 5, the plurality of cooling channels 240 includes one or more lateral channels 236. The one or more lateral channels 236 may extend beneath the one or more power device assemblies 100. For example, the one or more lateral channels 236 may be configured to direct cooling fluid proximate to a location where the one or more power devices assemblies 100 are embedded within the first PCB material layer 202. For example, the one or more power device assemblies 100 may be arranged in pairs including, for example, a first pair 101a, a second pair 101b, and a third pair 101c, each including a first power device assembly 100a and a second power device assembly 100b. A lateral channel of the one or more lateral channels 236 may extend beneath each pair 101a, 101b, 101c of power device assemblies 100. For example, a first lateral channel 242a may extend beneath the first pair 101a of power devices assemblies 100, a second lateral channel 242b may extend beneath the second pair 101b of power device assemblies 100, and/or a third lateral channel 242c may extend beneath the pair 101c of power device assemblies 100, thereby providing separate cooling channels 240 beneath each pair 101a, 101b, 101c of power devices assemblies 100.

In some embodiments, formed within the one or more lateral channels 236 may be a plurality of micro-channels 244. Each micro-channel 244 may be separated from one another via a channel wall 246. Accordingly, a plurality of micro-channels 244 (e.g., two or more micro-channels, four or more micro-channels, six or more micro-channels, or the like) may extend underneath each power device assembly 100 or pair of power device assemblies 100. The plurality of micro-channels 244 may have any desired cross-section such as, but not limited to, rectangular, circular, or the like. In some embodiments, it is contemplated that there may not be separate micro-channels 244, but instead each lateral channel 242a, 242b, 242c may define a single cooling channel.

Referring again to FIG. 2, in some embodiments, the method 10 may include forming a plurality of thermally conductive vias 250 within the first PCB material layer 202 that extends from the one or more power devices assemblies 100 to the one or more cooling channels 240. The thermally conductive vias 250 may be formed from any thermally conductive material including, but not limited to, copper, aluminum, silver, nickel, or the like. The plurality of thermally conductive vias 250 may be arranged within the first PCB material layer 202 so as to extend from a surface (for example, the second conductive substrate 114) of the one or more power device assemblies 100 and the one or more lateral channels 236. Accordingly the plurality of thermally conductive vias 250 may provide thermal conductivity from the one or more power device assemblies 100 to coolant circulated through the one or more cooling channels 240 (e.g., the one or more lateral channels 236). For example, and with reference to FIG. 6, the plurality of thermally conductive vias 250 may be arranged within the plurality of micro-channels 244 of the one or more lateral channels 236 beneath each power device assembly 100 of the one or more power device assemblies 100. For example, at a location of the one or more power device assemblies 100, holes may be formed (for example, via laser, drilling, or the like) within each micro-channel 244 up to the one or more power device assemblies 100 (e.g., the second conductive substrate 114). The plurality of thermally conductive vias 250 may then be deposited within the holes to provide a thermal path from one or more power device assemblies 100 to the plurality of micro-channels 244. The plurality of thermally conductive vias 250 may be formed within the plurality of micro-channels 244, at locations corresponding to a footprint of the one or more power device assemblies 100.

Figure 7:
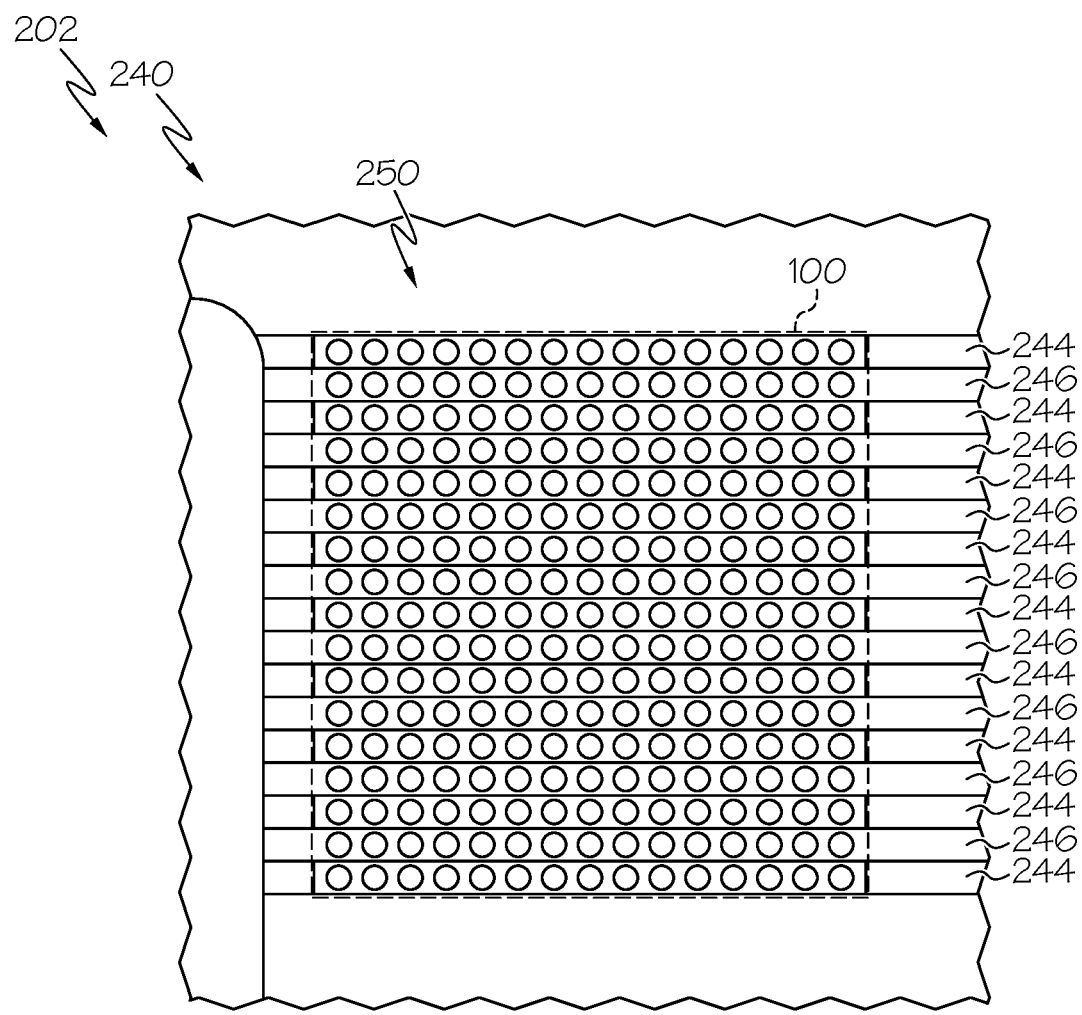
FIG. 7 depicts a plurality of thermally conductive vias formed within the one or more cooling channels and one or more channel walls separating each of the cooling changes of FIG. 5, according to one or more embodiments shown and described herein.

Referring now to FIG. 7, in some embodiments, the plurality of thermally conductive vias 250 may be formed both within the plurality of micro-channels 244 and within the channel walls 246 separating each of the plurality of micro-channels 244 from one another. In such embodiments, the thermally conductive vias 250 extending through the channel walls 246 may have a smaller cross-section diameter than vias located within the plurality of micro-channels 244. However, in other embodiments, the vias within the channel walls 246 and the vias within plurality of micro-channels 244 may have equal diameters. In yet further embodiments, the vias with the channel walls 246 may have larger diameters than the vias within the plurality of micro-channels 244.

Figure 8:
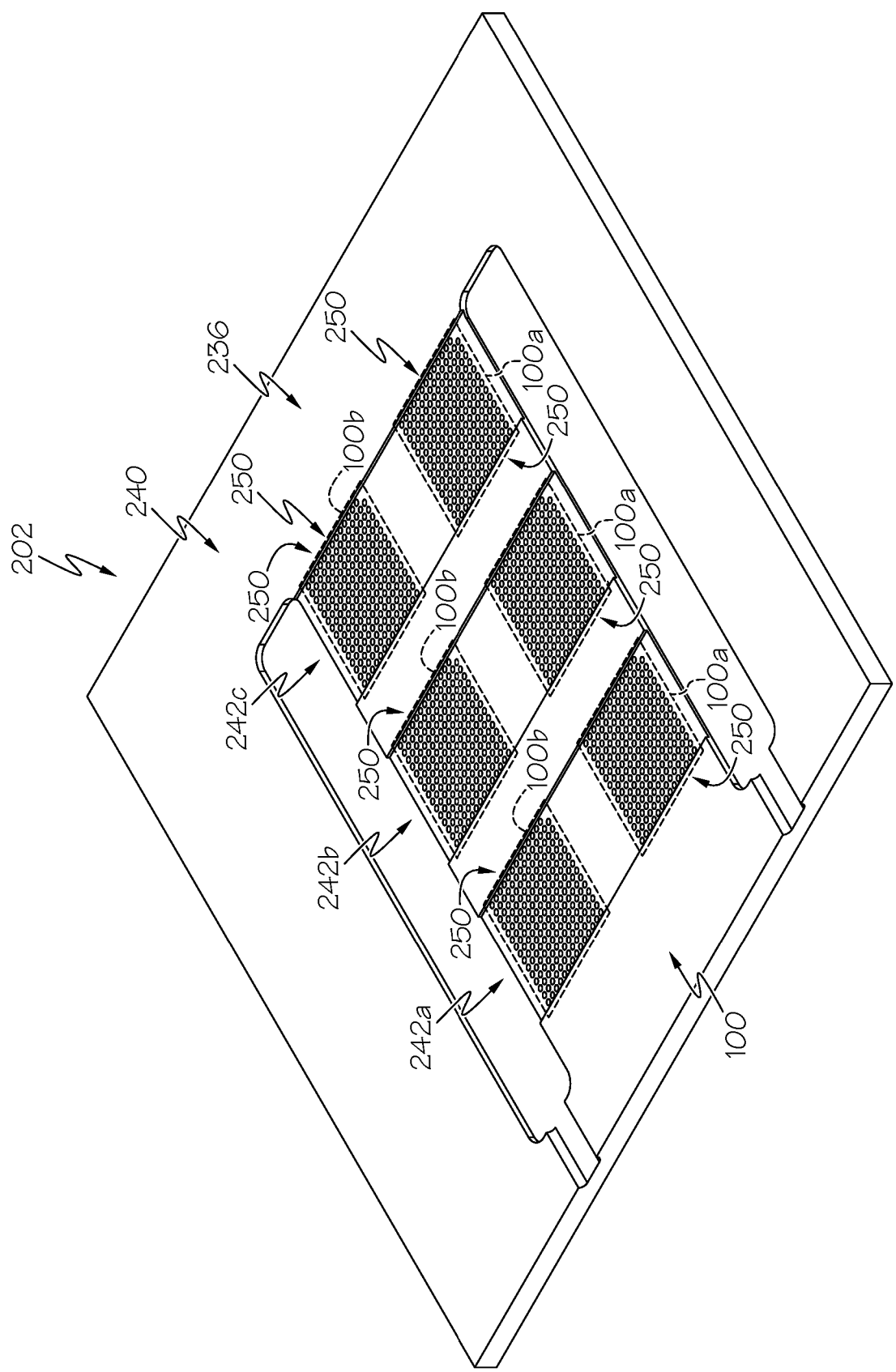
FIG. 8 depicts an embodiment of an illustrative PCB substrate comprising large cooling channels, according to one or more embodiments shown and described herein.

FIG. 8 illustrates an embodiment wherein a single lateral channel 242a, 242b, 242c extends under each pair 101a, 101b, 101c of power device assemblies 100. In such embodiments, the plurality of thermally conductive vias 250 may densely populate each region aligned with the one or more power device assemblies 100 to provide a thermal path from the one or more power device assemblies 100 to the lateral channel 242a, 242b, 242c that extends proximate thereto. However, in some embodiments, a layer of PCB material between the one or more power device assemblies 100 and the one or more lateral channels 236 may be thin enough to provide electrical insulation while allowing for thermal heat transfer through the PCB material to the one or more lateral channels 236. For example, in high power assemblies (e.g., between about 3 and 4 kW) the thickness of the PCB material arranged between the one or more lateral channels 236 and the power device assembly 100 may be about 100 micrometers. However, greater or thinner thicknesses are contemplated and possible based on the power rating of the one or more power device assemblies 100 and the material properties and insulation characteristics of the first PCB material layer 202. In such embodiments, no thermally conductive vias may be needed to provide a thermal path from the one or more power device assemblies 100 to the one or more lateral channels 236. Additionally, in such embodiments, since the PCB material may provide electrical insulation between the one or more power device assemblies 100 and the one or more lateral channels 236, a separate insulation layer 112 (and/or second conductive substrate 114) within the one or more power device assemblies 100 may not be included.

In some embodiments, once the one or more cooling channels 240 are formed in the first PCB material layer 202 and/or the second PCB material layer 204, one or more coatings may be applied to the second surface 212 of the first PCB material layer 202 and the first surface 252 of the second PCB material layer 204. For example, coatings may include nickel coatings, gold coatings, or the like. The coating may be only a few microns thick (e.g., less than about 10 μm, between about 5 μm and about 10 μm, or the like). In some embodiments, The one or more coatings may cover the whole of the second surface 108 of the second PCB substrate and the first surface 106 of the first PCB substrate or only a portion thereof. Such coatings may provide moisture impermeability to prevent leakage from the one or more cooling channels 240.

Referring again to FIG. 2, at block 20, the first PCB material layer 202 and the second PCB material layer 204 may be bonded to one another (e.g., diffusion bonded) to form a monolithic PCB substrate with embedded cooling channels 240. FIG. 10 illustrates the first PCB material layer 202 and the second PCB material layer 204 bonded to one another. Fluid fittings 270 may be inserted or bonded within the inlet port 232 and outlet port 233 to allow for fluid to be directed into and/or out of the one or more channels formed within the driver board assembly 200. For example, the fluid fittings 270 may include a circular cross-section at a first end 272 and an elliptical cross-section at the second end 274 for insertion into the inlet port 232 and the outlet port 233. The elliptical cross-section may aid in maintaining the thin profile of the driver board assembly 200 while circular cross-section at the first end 272 allowed the fitting to be connected to standard round plumbing fixtures (e.g., pipes, tubes, or the like). Accordingly, the driver board assembly 200 may be prepared for incorporation within a PCU, with integrated cooling features.

It should now be understood that embodiments of the present disclosure are directed to methods for assembling driver board assemblies and driver board assemblies. In the embodiments described herein methods include embedding one or more power device assemblies within a first printed circuit board (PCB) material layer. One or more cooling channels may be formed within the first PCB material layer adjacent (for example, beneath) the one or more power device assemblies. A second PCB material layer may be bonded to the first PCB material layer to enclose or encapsulate the one or more cooling channels between the first PCB material layer and the second PCB material layer for form a PCB substrate such that the one or more cooling channels are integrated within the driver board assembly. In some embodiments, thermally conductive vias may thermally couple the one or more power device assemblies to the one or more cooling channels. By integrating the one or more power device assemblies into a body of the PCB substrate, a more compact, power dense driver board may be achieved. Additionally, by providing integrated cooling channels, heat generated by the one or more power device assemblies may be transferred to coolant routed through the cooling channels. The thermal path between the one or more power device assemblies to the cooling channels may be very short, thereby reducing a side profile of the driver board assembly while increasing power density. Moreover, embodiments of the present disclosure are able to operate under high power (e.g., 40+ kW) environments, thereby providing a greater range of uses.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method of manufacturing a driver board assembly, the method comprising:
   encapsulating one or more power device assemblies within a first layer of a printed circuit board (PCB) such that the first layer surrounds the one or more power device assemblies;
   forming a first portion of one or more cooling channels within a surface of the first layer such that the one or more cooling channels extend proximate to the one or more power device assemblies;
   forming a second portion of the one or more cooling channels within a surface of a second layer of the PCB;
   forming a plurality of thermally conductive vias extending between a surface of the one or more power device assemblies and the one or more cooling channels; and
   bonding the second layer and the first layer such that the first portion and the second portion are aligned to define and to enclose the one or more cooling channels between the first layer and the second layer.

2. The method of claim 1, further comprising arranging the one or more power devices assemblies in an inverter topology.

3. The method of claim 1, further comprising:
   forming an inlet channel within at least one of the surface of the first layer and a surface of the second layer, the inlet channel comprising an inlet port configured to fluidly couple the one or more cooling channels to a coolant source; and
   forming an outlet channel within at least one of the surface of the first layer and the surface of the second layer, the outlet channel comprising an outlet port for removal of coolant from the one or more cooling channels.

4. The method of claim 3, wherein:
   the inlet channel comprises a first inlet channel portion formed within the first layer and a second inlet channel portion formed within the second layer, and the first inlet channel portion and the second inlet channel portion;
   the outlet channel comprises a first outlet channel portion formed within the first layer and a second outlet channel portion formed within the second layer; and
   bonding of the first layer to the second layer combines a volume of the first inlet channel portion with the second inlet channel portion and combines a volume of the first outlet channel portion and the second outlet channel portion.

5. The method of claim 3, wherein forming the one or more cooling channels comprises forming one or more lateral channels extending between and fluidly coupled to the inlet channel and the outlet channel.

6. The method of claim 1, further comprising:
   forming the one or more power device assemblies by:
      embedding a power device within a first conductive substrate comprising a recess configured to receive the power device;
      bonding an insulation layer to the first conductive substrate; and
      bonding a second conductive substrate to the first conductive substrate such that the insulation layer electrically insulates the first conductive substrate from the second conductive substrate.

7. A driver board assembly, comprising:
   a first layer of a PCB;
   one or more power device assemblies embedded within the first layer, the first layer encapsulating the one or more power device assemblies, the first layer surrounds the one or more power device assemblies;
   one or more cooling channels formed within a surface of the first layer such that the one or more cooling channels extend proximate to the one or more power device assemblies;
   a plurality of thermally conductive vias extending between a surface of the one or more power device assemblies and the one or more cooling channels; and
   a second layer of the PCB bonded to the first layer to enclose the one or more cooling channels between the first layer and the second layer,
   wherein each of the one or more cooling channels is at least partially formed in each of the first layer and the second layer.

8. The driver board assembly of claim 7, wherein the one or more power device assemblies comprise a plurality of power device assemblies arranged in an inverter topology.

9. The driver board assembly of claim 7, further comprising:
   an inlet channel comprising an inlet port fluidly coupled to the one or more cooling channels, the inlet channel configured to fluidly couple the one or more cooling channels to a coolant source; and
   an outlet channel comprising an outlet port fluidly coupled to the one or more cooling channels and configured to facilitate removal of coolant from the one or more cooling channels.

10. The driver board assembly of claim 9, wherein each of the inlet channel and the outlet channel are at least partially formed in each of the first layer and the second layer.

11. The driver board assembly of claim 7, wherein the plurality of thermally conductive vias extend through a channel wall, the channel wall separates each of the one or more cooling channels.

12. The driver board assembly of claim 7, wherein each of the one or more power device assemblies comprise:
   a first conductive substrate comprising a recess;
   a power device positioned within the recess;
   an insulation layer bonded to the first conductive substrate; and
   a second conductive substrate bonded to the first conductive substrate such that the insulation layer electrically insulates the first conductive substrate from the second conductive substrate.

13. A driver board assembly, comprising:
   a first layer of a PCB;
   one or more power device assemblies embedded within the first layer, the first layer encapsulating the one or more power device assemblies, the first layer surrounds the one or more power device assemblies;
   one or more cooling channels formed within a surface of the first layer such that the one or more cooling channels extend proximate to the one or more power device assemblies; and
   a second layer of the PCB bonded to the first layer to enclose the one or more cooling channels between the first layer and the second layer,
   wherein each of the one or more cooling channels is at least partially formed in each of the first layer and the second layer.

14. The driver board assembly of claim 13, wherein the one or more cooling channels are spaced from the one or more power device assemblies via an insulation layer having a thickness of about 100 µm or less.

15. The driver board assembly of claim 13, further comprising:
the one or more power device assemblies comprising a plurality of power device assemblies;
a first pair of the plurality of power device assemblies; and
a second pair of the plurality of power device assemblies, wherein the one or more cooling channels comprise:
a first lateral channel extending beneath the first pair of power device assemblies; and
a second lateral channel extending beneath the second pair of power device assemblies.

16. The driver board assembly of claim 13, wherein the one or more power device assemblies comprise a plurality of power device assemblies arranged in an inverter topology.

17. The driver board assembly of claim 13, further comprising:
an inlet channel comprising an inlet port fluidly coupled to the one or more cooling channels, the inlet channel configured to fluidly couple the one or more cooling channels to a coolant source; and
an outlet channel comprising an outlet port fluidly coupled to the one or more cooling channels, and configured to facilitate removal of coolant from the one or more cooling channels.

18. The driver board assembly of claim 17, wherein each of the inlet channel and the outlet channel are at least partially formed in each of the first layer and the second layer.

19. The method of claim 1, further comprising forming a conductive pathway electrically coupled to the one or more power devices.

20. The method of claim 1, wherein encapsulating one or more power device assemblies within the first layer comprises forming the first layer in contact with the one or more power device assemblies.

* * * * *

UNITED STATES PATENT AND TRADEMARK OFFICE
CERTIFICATE OF CORRECTION

| | |
|---|---|
| PATENT NO. | : 11,602,044 B2 |
| APPLICATION NO. | : 16/943470 |
| DATED | : March 7, 2023 |
| INVENTOR(S) | : Feng Zhou |

It is certified that error appears in the above-identified patent and that said Letters Patent is hereby corrected as shown below:

In the Specification

In Column 1, Line(s) 25, before "may be", delete "is".

In Column 2, Line(s) 56, after "coupled to", delete "a".

Signed and Sealed this
Eighteenth Day of April, 2023

*Katherine Kelly Vidal*

Katherine Kelly Vidal
*Director of the United States Patent and Trademark Office*